(12) United States Patent
Tsujimoto et al.

(10) Patent No.: US 8,196,632 B2
(45) Date of Patent: Jun. 12, 2012

(54) MOUNTING APPARATUS AND MOUNTING METHOD

(75) Inventors: Masaki Tsujimoto, Itabashi-ku (JP); Kenji Kobayashi, Itabashi-ku (JP); Takahisa Yoshioka, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 667 days.

(21) Appl. No.: 10/574,847

(22) PCT Filed: Sep. 29, 2004

(86) PCT No.: PCT/JP2004/014198
§ 371 (c)(1),
(2), (4) Date: Apr. 6, 2006

(87) PCT Pub. No.: WO2005/036628
PCT Pub. Date: Apr. 21, 2005

(65) Prior Publication Data
US 2007/0131344 A1    Jun. 14, 2007

(30) Foreign Application Priority Data
Oct. 10, 2003   (JP) .................. 2003-351900

(51) Int. Cl.
*B29C 65/00*   (2006.01)
*B32B 37/00*   (2006.01)
*B32B 38/04*   (2006.01)
*B32B 38/10*   (2006.01)

(52) U.S. Cl. ........ 156/517; 156/524; 156/264; 156/234; 156/238; 156/521

(58) Field of Classification Search .............. 156/521, 156/542, 264, 270, 517
See application file for complete search history.

(56) References Cited

U.S. PATENT DOCUMENTS
3,860,473 A * 1/1975 Wesen .......................... 156/252
5,730,816 A * 3/1998 Murphy ......................... 156/64
(Continued)

FOREIGN PATENT DOCUMENTS
EP    1320121 A2   6/2003
(Continued)

OTHER PUBLICATIONS
International Search Report of International Application PCT/JP2004/014198 mailed Jan. 18, 2005.

*Primary Examiner* — Linda L Gray
(74) *Attorney, Agent, or Firm* — Westerman, Hattori, Daniels & Adrian, LLP (57) ABSTRACT

There is provided a mounting apparatus capable of forming dicing tapes in the process of feeding-out a strip material, and sticking the dicing tape to a ring frame to fix a semiconductor wafer.
The mounting apparatus 10 sticks the dicing tape to the ring frame RF to fix the semiconductor wafer to the ring frame in a state that the ring frame RF and the semiconductor wafer W are disposed on a table 11. The mounting apparatus 10 includes a pre-cut means 13 for forming a cut L in a state of half cut in a film FL of a strip material A to form a dicing tape T in the process of feeding out the strip material A and a sticking means 34 for peeling off the dicing tape from a base sheet S to stick the dicing tape to the ring frame RF.

8 Claims, 6 Drawing Sheets

U.S. PATENT DOCUMENTS

| | | | |
|---|---|---|---|
| 5,961,768 A * | 10/1999 | Tsujimoto | 156/285 |
| 6,238,515 B1 * | 5/2001 | Tsujimoto et al. | 156/379.8 |
| 6,500,291 B1 * | 12/2002 | Okada et al. | 156/230 |
| 6,634,401 B2 * | 10/2003 | Kuhn et al. | 156/510 |
| 6,689,245 B2 * | 2/2004 | Tsujimoto | 156/267 |
| 6,767,426 B1 * | 7/2004 | Yamamoto | 156/270 |
| 2002/0056523 A1 | 5/2002 | Ishinoda | |
| 2002/0187589 A1 | 12/2002 | Tsujimoto | |
| 2003/0044481 A1* | 3/2003 | Beaudry | 425/6 |
| 2004/0007327 A1* | 1/2004 | Kobayashi | 156/353 |
| 2004/0009650 A1* | 1/2004 | Jeong et al. | 438/462 |

FOREIGN PATENT DOCUMENTS

| | | |
|---|---|---|
| JP | 6-216242 | 8/1994 |
| JP | 10-189694 | 7/1998 |
| JP | 2002-151528 | 5/2002 |
| JP | 2002-353296 | 12/2002 |
| TW | 377036 | 12/1999 |
| TW | 377850 | 12/1999 |
| TW | 377894 | 12/1999 |
| WO | WO 0015354 A1 * | 3/2000 |

\* cited by examiner

MOUNTING APPARATUS AND MOUNTING METHOD

TECHNICAL FIELD

The present invention relates to a mounting apparatus and a mounting method, and more particularly to a mounting apparatus and a mounting method capable of, when fixing a semiconductor wafer to a ring frame, forming dicing tapes one by one from a strip material, in which a film for forming dicing tapes is stuck to one surface of a base sheet, and fixing the semiconductor wafer to the ring frame by using the dicing tape.

BACKGROUND OF THE INVENTION

Conventionally, in dicing a semiconductor wafer on which a circuit surface is formed, the semiconductor wafer is disposed in an inside area of a ring frame, and a dicing tape is stuck on the surface thereof to fix the semiconductor wafer to the ring frame. As for sticking of the dicing tape, the method is known in which after sticking a continuous dicing tape of a strip shape to the ring frame and the semiconductor wafer, a peripheral side of the dicing tape is cut off in accordance with the shape of the ring frame with a cutter.

As another sticking method, for example, as disclosed in a Patent Document 1, there has been employed a method in which, using a rolled raw sheet having label-like dicing tapes formed thereon, which are previously provided with a cut on the surface of the film in accordance with the shape of the ring frame, the dicing tapes are peeled off one by one in the process of feeding out the raw sheet and stuck onto the ring frame.

[Patent Document 1] Japanese Patent Application Laid-open No. Hei 6-216242

However, in the former method in which, after a dicing tape continuing in a strip shape is stuck, a peripheral side of the tape is cut off with a cutter in accordance with the shape of the ring frame, there resides such a disadvantage that the ring frame is considerably damaged by the cutter blade since the dicing tape is cut off within a surface of the ring frame. Particularly, in the case where a resin ring frame is used to achieve low manufacturing cost and weight reduction, the degree of the damage is further considerable. Moreover, the refuse of the tape cut off with the cutter comes to considerable amount, which results in a disadvantage of wasteful material consumption and economical burden.

On the other hand, as disclosed in the Patent Document 1, in such a method that a dicing tape previously cut in a shape of the ring frame is stuck, a different process to form dicing tapes of a label-like shape in the surface of the film is required. In addition, when a material of tape base is rigid and thick, there is such a disadvantage that the tape base is peeled off from a base sheet during feeding out. Further, the dicing tape with the cut of the label shape formed thereon is wound in a roll-like shape in a state that the dicing tape is stuck to the base sheet via adhesive. Therefore, the dicing tape is not wound always in such a state that the dicing tapes in each layer along the diameter direction of the roll are precisely overlapped with each other. As a result, due to an elastic deformation of the adhesive and edges of the dicing tapes overlapping with each other, a press-trace (step) or a press-damage due to the winding pressure is formed in the surface of the dicing tape, resulting in a serious deterioration of the plane accuracy. When the dicing tape having such press-trace or press-damage is stuck to the ring frame, it may cause a problem of aeration and the like due to deteriorated plane accuracy, which can be a cause of sticking failure or the like.

The present invention has been proposed in view of the above disadvantages. It is an object of the present invention to provide a mounting apparatus and a mounting method capable of forming dicing tapes in a predetermined shape in the process of feeding out a strip material while sticking the dicing tape to a semiconductor wafer and a ring frame immediately after the tape is formed, and thereby eliminating cutting process with a cutter after sticking the dicing tape.

Another object of the present invention is to provide a mounting apparatus and a mounting method capable of preventing the conventional problems due to the winding pressure, thereby increasing a sticking accuracy.

To achieve the objects, an apparatus according to the present invention employs an arrangement such that a mounting apparatus for fixing a semiconductor wafer to a ring frame by sticking a dicing tape to the ring frame in a state that the semiconductor wafer is disposed in an inside area of the ring frame disposed on a table, the apparatus includes:

a supporting means for supporting a strip material attaching a film for forming dicing tapes stuck on one surface of a base sheet;

a pre-cut means for forming a dicing tape by forming a cut in the film in accordance with the size of the ring frame; and a sticking means for fixing the semiconductor wafer to the ring frame by peeling off the dicing tape from the base sheet and sticking the dicing tape onto the ring frame.

In the mounting apparatus, it is preferable that a tension control means be disposed between the supporting means and a pre-cut means, the tension control means including: a dancer roller which is movable vertically so as to allow the strip material to be fed out toward the sticking means while giving tension due to its own weight to the strip material; and first and second sensors for detecting a raised position and a lowered position of the dancer roller, respectively, wherein, when the first sensor detects the dancer roller at the raised position, the supporting means feeds out the strip material by a predetermined amount to lower the dancer roller; and wherein, when the second sensor detects the dancer roller at the lowered position, the supporting means stops feeding out the strip material therefrom.

Further, a method according to the present invention is a mounting method in which a ring frame is disposed on a table while a semiconductor wafer is disposed in an inside area of the ring frame, and a dicing tape is stuck onto the ring frame to fix a semiconductor wafer to the ring frame, the method including the steps of:

forming a cut in a film in accordance with the size of the ring frame in the process of feeding out a strip material attaching the film for forming dicing tapes stuck on one surface of a base sheet;

peeling off the dicing tape formed inside the cut from the base sheet; and moving the dicing tape and the table relative to each other to stick the dicing tape onto the semiconductor wafer and the ring frame, thereby fixing the semiconductor wafer to the ring frame.

In the method, it is preferable that a tension control means be disposed between the supporting means and a pre-cut means, the tension control means including: a dancer roller which is movable vertically so as to allow the strip material to be fed out toward the sticking means while giving tension due to its own weight to the strip material, and first and second sensors for detecting a raised position and a lowered position of the dancer roller, wherein, the following operations are repeated; i.e., when the first sensor detects the dancer roller at the raised position, the supporting means feeds out the strip material of a predetermined amount to lower the dancer roller, and when the second sensor detects the dancer roller at the lowered position, the supporting means stops feeding out the strip material therefrom.

According to the present invention, a strip material is formed in a state that a film for forming a dicing tape is stuck to a base sheet, and the strip material is fed out from a state being wound in a roll-like shape. In the strip material fed out, a pre-cut means forms a cut at a position on the way of feeding so as to have a plane configuration corresponding to the shape of the ring frame and the dicing tape is formed in an inside area enclosed by the cut line. The dicing tape is, for example, peeled off via a peel plate or the like, and then stuck to the ring frame and the semiconductor wafer. Therefore, a process to cut a film on a ring frame after sticking is not required; thus, the ring frame is prevented from being damaged. Further, since the dicing tapes are formed in the feed-out process from the rolled raw sheet, the dicing tapes are prevented from forming press-trace, press-damage or the like due to the aforementioned winding pressure. Owing to this, the dicing tape can be stuck to the semiconductor wafer and the ring frame in a state that plane accuracy is maintained with high accuracy.

Furthermore, since the tension control means are provided, the tension to the strip material can be always maintained at a constant level, and the sticking position of the dicing tape after the pre-cutting can be maintained with a high accuracy.

DETAILED DESCRIPTION OF THE INVENTION

Hereinafter, preferred embodiments of the present invention will be described with reference to the drawings.

Figure 1:
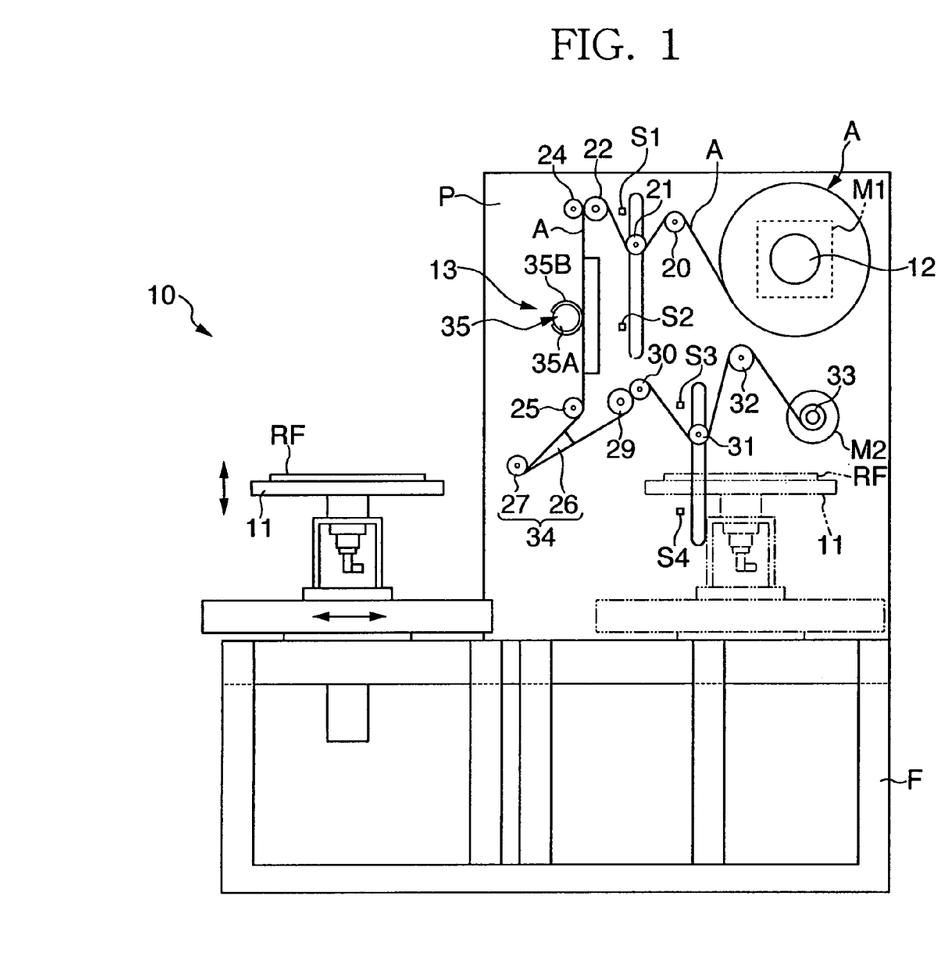
FIG. 1 is an elevation schematically showing the mounting apparatus in accordance with the present embodiment.
Figure 2:
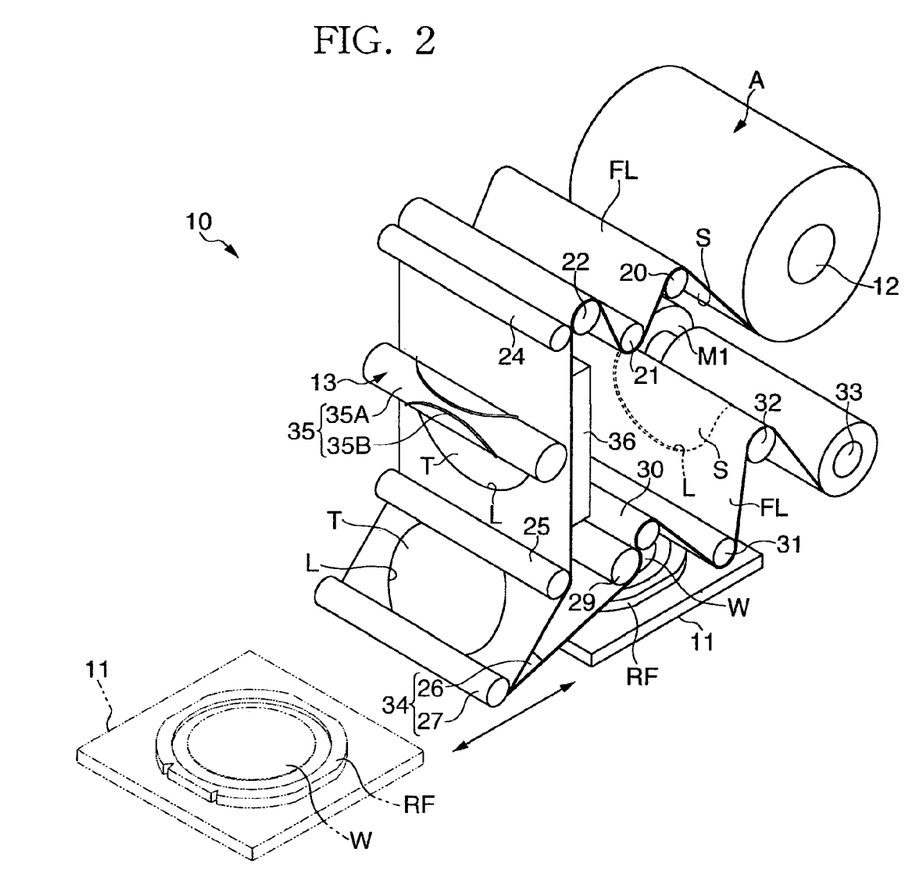
FIG. 2 is a perspective view schematically showing an essential part in FIG. 1.

FIG. 1 shows a schematic elevation of a mounting apparatus in accordance with the embodiment, and FIG. 2 shows a perspective view schematically illustrating an essential part thereof. Referring to these figures, a mounting apparatus 10 placed on a frame F is structured by including: a table 11 capable of placing a ring frame RF and a semiconductor wafer W (refer to FIG. 3) on the upper face thereof; a support roller 12 (supporting means), which is brake-controllable, for supporting a rolled raw sheet so as to be able to feed out the same, the roller 12 being disposed within a face of a plate P supported by the frame F; a pre-cut device 13 for forming a substantially circular cut in a strip material A fed out from the support roller 12 to form a dicing tape T (refer to FIG. 2); and a sticking means 34 that peels off the dicing tape T and sticks the same to the ring frame RF and the semiconductor wafer W.

Figure 3:
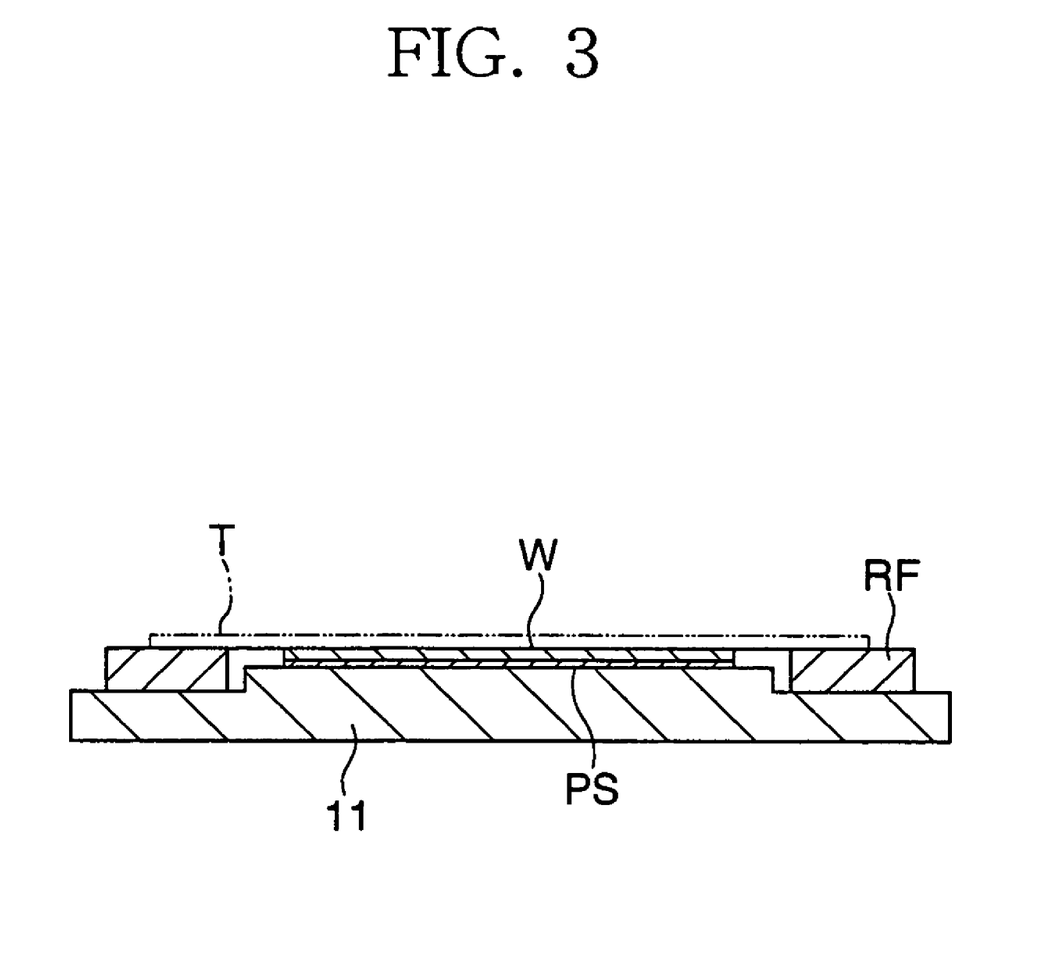
FIG. 3 is a sectional view schematically showing a table.

The table 11 is arranged capable of moving vertically and also along the lateral direction in FIG. 1 so as to perform sticking operation of the dicing tape T while moving from the right position indicated with a chain double-dashed line in FIG. 1, toward the left position. As shown in FIG. 3, the table 11 is arranged in a plane configuration in which the central surface position is slightly higher than the position of the peripheral surface. Owing to this, the positions of the upper faces of the ring frame RF and the semiconductor wafer W are arranged to be substantially at the same level with each other. Also, the table 11 is provided with a plurality of suction holes (not shown) opened to the upper face side, and is arranged so that the ring frame RF and the semiconductor wafer W disposed on the upper face are maintained at a predetermined position by means of the operation of a decompression pump (not shown). Note that the ring frame RF and the semiconductor wafer W are set on the table 11 in a state being adjusted in an aligned position via an alignment device (not shown). In this case, the semiconductor wafer W is in a state that a circuit surface formed at bottom face side thereof is covered with a protective sheet PS (refer to FIG. 3).

The strip material A is formed so that a film FL is stuck to one surface of a base sheet S, which is composed of release liner or the like, as shown in FIG. 2, and the strip material A is arranged to be supported by the support roller 12 as a rolled raw sheet and fed out therefrom successively.

The support roller 12 is coupled to the output shaft of a motor M1, and is adapted to feed out the strip material A over a predetermined length through an intermittent rotation of the motor M1 at specific timing (which will be described later). Further, along the feed-out direction of the strip material A from the support roller 12 toward the downstream-side, there are disposed in order: a guide roller 20; a dancer roller 21 as a tension maintaining means that gives a constant tension due to its own weight to the strip material A; first and second sensors S1 and S2 for detecting a raised position and a lowered position of the dancer roller 21 respectively; an upstream-side tension roller 22 which is given with a biasing force in the clockwise direction in FIG. 1; a pinch roller 24 abutting on the peripheral surface of the tension roller 22; a guide roller 25 located at the downstream-side behind the pre-cut means 13; a peel plate 26 that turns the strip material A sharply to peel off the dicing tape T; a press roller 27 that is located at the front end side of the peel plate 26 and is adapted to be movable vertically and to press the peeled dicing tape T onto the upper face of the ring frame RF and the semiconductor wafer W; a downstream-side tension roller 29 given with a biasing force in the counterclockwise direction in FIG. 1; a pinch roller 30 abutting on the peripheral surface thereof; a downstream-side dancer roller 31 for maintaining the tension of the strip material A at the downstream-side in the feed-out direction; third and fourth sensors S3 and S4 for detecting the dancer roller 31 at the raised position and the lowered position respectively; a guide roller 32; a winding roller 33; and a motor M2 for driving to rotate the winding roller 33.

The motor M2 is adapted to stop the winding rotation of the winding roller 33, when the third sensor S3 detects the dancer roller 31 at the raised position, and on the other hand is adapted to start the winding rotation of the winding roller 33 when the fourth sensor S4 detects the dancer roller 31 at the lowered position due to feeding-out of the strip material A. It should be noted that the press roller 27 is rotatably supported by the output shaft of a motor (not shown) via predetermined gears and arranged to give a feeding-out force to the strip material A and also to give a press force to the peeled dicing tape T for sticking the same to the upper face of the ring frame RF and the semiconductor wafer W (refer to Japanese Patent No. 3174917). Thus, the peel plate 26 and the press roller 27 construct the sticking means 34.

The pre-cut device 13 includes a die roller 35 located at the film FL side of the strip material A and a die receive plate 36 disposed so as to sandwich the strip material A between the die roller 35 and the same. The die roller 35 is structured by including a cutter blade 35B on the peripheral side of a roller 35A and is arranged so that, when the die roller 35 rotates, a cut L is formed in a half cut state on the surface of the film FL; and thus, a dicing tape T is formed in the area enclosed by the cut L. A various types of the die rollers 35 are prepared in accordance with the size of the ring frames RF so as to be exchangeable in accordance with the target ring frame RF.

Although not illustrated in the figures, it is arranged so that the front end position in the feed-out direction of the die-cut tape T formed by the pre-cut device 13 is detected by a sensor (not shown) and is timing-controllable with the sticking start position onto the ring frame RF on the table 11, which goes through the position of the sticking means 34.

Now, the entire operation in the embodiment will be described.

In the initial setting, the raw sheet of the strip material A supported by the support roller 12 is pulled out by a predetermined length and laid around the above-described rollers, and the lead end thereof is fixed to the winding roller 33.

A ring frame RF and a semiconductor wafer W are placed on the table 11 by means of an appropriate transfer robot so as to be aligned with each other and sucked to be held on the table 11.

When a given switch is turned on, the press roller 27 rotates to give a feed-out force to the strip material A sandwiched between the press roller 27 and the peel plate 26, and the dancer roller 21 is raised; thus the strip material A is fed out. When the dancer roller 21 is detected at the raised position by the first sensor S1, the motor M1 drives to feed out the strip material A from the support roller 12; and accordingly, the dancer roller 21 is lowered. The motor M1 continues to drive until the dancer roller 21 is detected at the lowered position by the second sensor S2. In this way, the dancer roller 21 gives a constant tension to the strip material A continuously by means of its own weight. The upstream-side tension roller 22 is biased in the clockwise direction, and the downstream-side tension roller 29 is biased in the counterclockwise direction.

As the strip material A is fed out, the dancer roller 31 located at the downstream side moves downward, and when the dancer roller 31 is detected at the lowered position by the fourth sensor S4, the motor M2 of the winding roller 33 is driven to start winding; and the winding continues until the dancer roller 31 is detected at the raised position by the third sensor S3. In such a series of the feed-out process of the strip material A, the pre-cut device 13 forms a cut L in a half cut state in the surface of the film FL by means of the rotation of the die roller 35; and thus the dicing tape T is formed.

Figure 4:
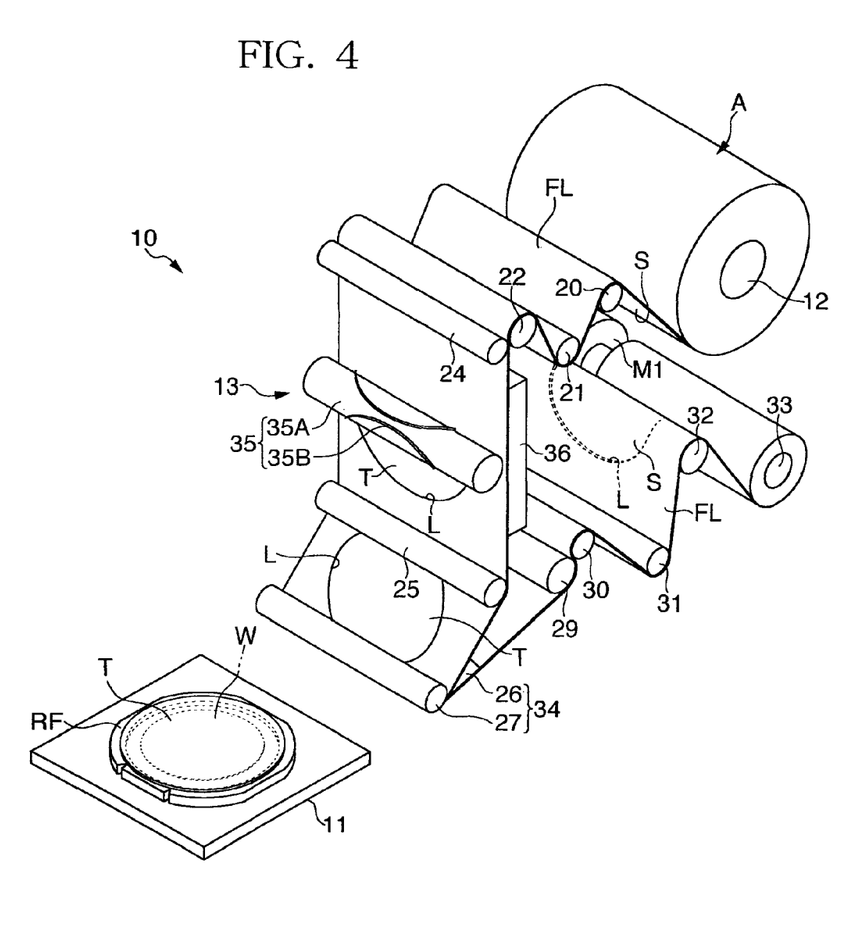
FIG. 4 is a perspective view identical to FIG. 2 schematically showing a state after a dicing tape is stuck.

In a state immediately before the dicing tape T passes the position of the peel plate 26, the table 11 moves leftward from the standing-by position at right side in FIG. 1. The timing is controlled by means of a sensor (not shown) such that, when the front end of the dicing tape T in the feed-out direction is peeled off, the front end side of the ring frame RF in the traveling direction is adjusted to be positioned beneath the front end of the dicing tape T; the peeling speed is controlled to be substantially synchronous with the traveling speed of the table 11 toward the left side in FIG. 1; and thus the dicing tape T is stuck onto the ring frame RF with the press roller 27 (refer to FIG. 4).

In this way, after the semiconductor wafer W is fixed to the ring frame RF, the semiconductor wafer W is sucked and held via a transfer apparatus (not shown) along with the ring frame RF, turned upside down and transferred to the next process.

After the protective sheet PS, which is stuck on the circuit surface side of the semiconductor wafer W, is peeled off, the semiconductor wafer W is subjected to the dicing process.

According to the embodiment as described above, since the dicing tape T having a plane shape corresponding to the shape of the ring frame RF can be stuck immediately after the dicing tape T is formed from the strip material A, the process for cutting off the film FL on the ring frame RF after sticking can be eliminated. Furthermore, this is not the case that such strip material is used as having the dicing tapes previously formed to be of label configuration and being wound in a roll shape, consequently the dicing tape can be stuck in a state the plane accuracy is maintained at a high level.

The most preferable arrangement and method for carrying out the present invention have been disclosed so far. However, the present invention is not limited to the above.

That is, the present invention has been illustrated and described mainly about a specific embodiment. However, it is possible for those skilled in the art to add various modifications to aforementioned embodiment with respect to shape, material, quantity or other detailed arrangements without departing from the technical spirit and the range of the object of the present invention.

Therefore, the descriptions with the limited configuration and material disclosed above are given for the purpose of illustrating only to facilitate the understanding of the present invention, not intending to limit the present invention. Accordingly, the descriptions using appellations of members excluding a part or all of these limitations on the configuration, material and the like should be understood to be included within the present invention.

Figure 5:
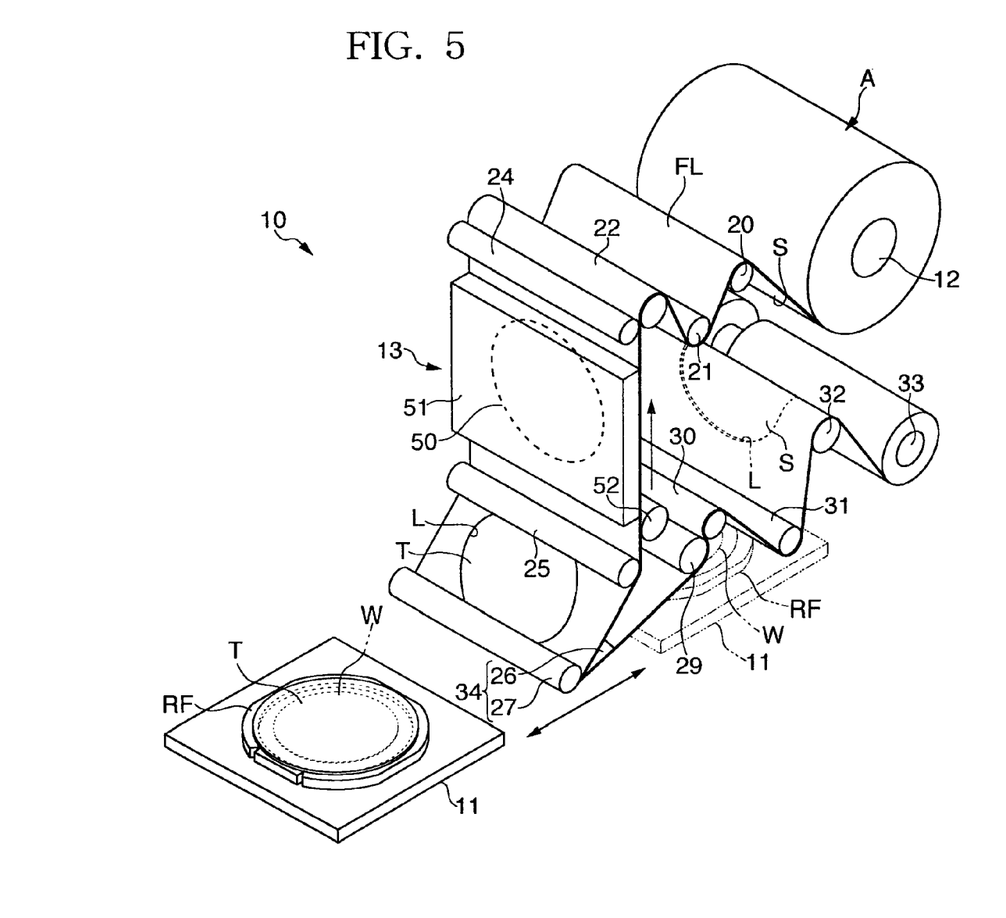
FIG. 5 is a perspective view schematically showing an essential part of a modification.

For example, in the above embodiment, such a case has been described that the die roller 35 is employed for the pre-cut device 13. The pre-cut device 13, however, may be replaced with a variety of structures. Specifically, as shown in FIG. 5, a die plate 51 equipped with a substantially circular blade 50 may be employed in place of the die roller 35; and in place of the die receive plate 36, a movable roller 52 may be employed. And a movable roller 52 may be arranged to move along the vertical direction while rotating, and thus the dicing tape T may be formed.

Figure 6:
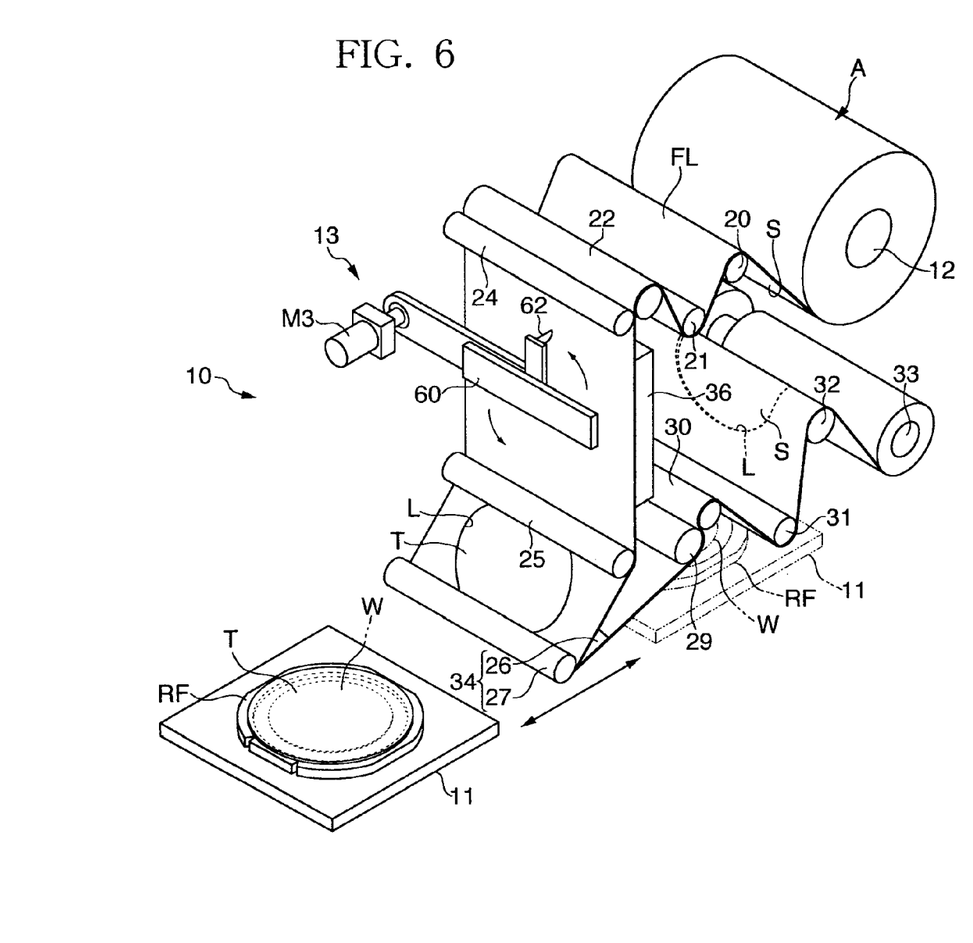
FIG. 6 is a perspective view schematically showing an essential part of further another modification.

Further, an arm type cutter, as shown in FIG. 6, may be employed for the pre-cut device 13. The pre-cut device 13 of this type includes a motor M3 fixed to a frame (not shown), a rotation member 60 rotatable by the drive of motor M3 and a blade 62 held by the rotation member 60; and substantially circular dicing tape T can be formed by the rotation of the rotation member 60. In this case, when the blade 62 is arranged to be adjustable in terms of the position from the rotation center, the pre-cut device 13 is readily applicable to the ring frames of various sizes.

It should be noted that the pre-cut device 13 according to the embodiment shown in FIG. 1 forms the dicing tape T in a state that the strip material A is fed out continuously, and the pre-cut devices 13 shown in FIGS. 5 and 6 are applicable to the case where the strip material A is fed out intermittently.

INDUSTRIAL APPLICABILITY

The present invention is applicable to a semiconductor wafer processing apparatus.

The invention claimed is:
1. A mounting apparatus, comprising:
 a table, on which a ring shaped first adherend and a plate shaped second adherend are disposed, the second adherend being disposed inside of the first adherend;

a supporting device capable of supporting a strip material including a film stuck on a surface of a base sheet;

a pre-cutting device having a first member located on a film side of the strip material and a second member located on a base sheet side of the strip material, the first member having a blade which forms a closed loop cut on the film, said closed loop having a width less than a width of said film, thereby forming a pre-cut portion of said film;

a peeling device for peeling the pre-cut portion from said base sheet, said peeling device being located downstream of said pre-cutting device in the sheet feeding direction of the strip material; and a press roller positioned at a downstream end of said peeling device, in the sheet feeding direction, for pressing the pre-cut portion so as to stick said pre-cut portion to the first and second adherends;

wherein said pre-cutting device is configured such that the cut is made from a face of said film opposite the face of said film which is to be peeled from the base sheet by said peeling device, and wherein said press roller is configured to press the pre-cut portion on the face of said film opposite the face of said film peeled from the base sheet by said peeling device.

2. The mounting apparatus according to claim 1, further comprising a winding device for continuously winding the strip material after peeling the pre-cut portions from the base sheet.

3. The mounting apparatus according to claim 1, wherein the first member is formed by a die roller having said blade which forms said closed loop, and the second member is a die receiving plate.

4. The mounting apparatus according to claim 2, wherein the first member is formed by a die roller having said blade which forms said closed loop, and the second member is a die receiving plate.

5. The mounting apparatus according to claim 1, wherein the first member is a die plate having said blade which forms said closed loop thereon and the second member is a movable roller.

6. The mounting apparatus according to claim 2, wherein the first member is a die plate having said blade which forms said closed loop thereon and the second member is a movable roller.

7. The mounting apparatus according to claim 1,
wherein the first member includes a rotation member capable of rotating about an axis parallel to the surface of the film and the second member is a receiving plate, and
wherein said blade which forms said closed loop is held by the free end side of the rotation member.

8. The mounting apparatus according to claim 2,
wherein the first member includes a rotation member capable of rotating about an axis parallel to the surface of the film and the second member is a receiving plate, and
wherein said blade which forms said closed loop is held by the free end side of the rotation member.

* * * * *